(12) United States Patent
Rombach

(10) Patent No.: US 10,056,911 B2
(45) Date of Patent: Aug. 21, 2018

(54) CONTINUOUS COARSE-TUNED PHASE LOCKED LOOP

(71) Applicant: TEXAS INSTRUMENTS INCORPORATED, Dallas, TX (US)

(72) Inventor: Gerd Rombach, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/385,109

(22) Filed: Dec. 20, 2016

(65) Prior Publication Data

US 2017/0179964 A1 Jun. 22, 2017

Related U.S. Application Data

(60) Provisional application No. 62/270,525, filed on Dec. 21, 2015.

(51) Int. Cl.
*H03L 7/06* (2006.01)
*H03L 7/099* (2006.01)
*H03L 7/10* (2006.01)

(52) U.S. Cl.
CPC .............. *H03L 7/099* (2013.01); *H03L 7/103* (2013.01); *H03L 2207/06* (2013.01)

(58) Field of Classification Search
CPC ....................................................... H03L 7/099
See application file for complete search history.

(56) References Cited

U.S. PATENT DOCUMENTS

| | | | | |
|---|---|---|---|---|
| 6,094,473 | A * | 7/2000 | Yu ............................. | H05G 1/38 378/108 |
| 6,188,739 | B1 * | 2/2001 | Everitt ................... | H03L 7/0893 327/157 |
| 8,373,465 | B1 | 2/2013 | Sareen et al. | |
| 2006/0017477 | A1 | 1/2006 | Miki et al. | |
| 2008/0157889 | A1 * | 7/2008 | Yu ............................. | H03B 5/04 331/1 R |
| 2011/0298507 | A1 | 12/2011 | Jakobsson et al. | |
| 2014/0346960 | A1 | 11/2014 | Lenk | |

FOREIGN PATENT DOCUMENTS

| WO | WO2009118587 A1 | 10/2009 |
|---|---|---|
| WO | WO2014139430 A1 | 9/2014 |

OTHER PUBLICATIONS

International Search Report and Written Opinion dated Mar. 6, 2017, PCT/US2016/068074, 8 pages.

* cited by examiner

*Primary Examiner* — Daniel Puentes
(74) *Attorney, Agent, or Firm* — John R. Pessetto; Charles A. Brill; Frank D. Cimino

(57) ABSTRACT

In some embodiments, a phase-locked loop (PLL) system comprises a phase-frequency detector (PFD) configured to compare a phase-frequency reference signal and a feedback signal, a charge pump (CP) electrically coupled to the PFD and configured to produce a first tuning signal based on an output of the PFD, multiple integrator cells electrically coupled to the CP and configured to output multiple second tuning signals based on a voltage of the first tuning signal relative to a voltage reference signal, and a voltage-controlled oscillator (VCO) electrically coupled to the CP and to the multiple integrator cells and configured to adjust a capacitance value of the VCO based on the multiple second tuning signals. The capacitance value and the first tuning signal affect a frequency of the feedback signal.

14 Claims, 6 Drawing Sheets

CONTINUOUS COARSE-TUNED PHASE LOCKED LOOP

CROSS-REFERENCE TO RELATED APPLICATIONS

The present application claims priority to U.S. Provisional Patent Application No. 62/270,525, which was filed on Dec. 21, 2015, is titled "Continuous Coarse Tuned PLL With Sample-Reset Loop Filter," and is hereby incorporated herein by reference in its entirety.

BACKGROUND

Phase-locked loop (PLL) systems are used in various applications to match the phase and frequency of one signal to those of a reference signal. Although different PLLs may include different components, most PLLs include a phase-frequency detector (PFD), a low-pass filter, and an oscillator (e.g., a voltage-controlled oscillator (VCO)). Some of these components may introduce phase noise to the tuning signal that is provided to the VCO—for instance, distortions in the rising or falling edges of each pulse in the tuning signal. The VCO applies a gain to the tuning signal when producing the output signal, and this gain is undesirably applied to the phase noise as well.

To mitigate the amplification of phase noise, it may be desirable to reduce the VCO gain. Decreasing the VCO gain requires widening the voltage swing of the tuning signal provided to the VCO (e.g., a rail-to-rail swing). The PLL, however, may contain components—such as charge pumps and VCO varactors—that do not respond favorably to wide-swing tuning signals because they do not operate linearly at all tuning signal voltage values.

SUMMARY

In some embodiments, a phase-locked loop (PLL) system comprises a phase-frequency detector (PFD) configured to compare a phase-frequency reference signal and a feedback signal, a charge pump (CP) electrically coupled to the PFD and configured to produce a first tuning signal based on an output of the PFD, multiple integrator cells electrically coupled to the CP and configured to output multiple second tuning signals based on a voltage of the first tuning signal relative to a voltage reference signal, and a voltage-controlled oscillator (VCO) electrically coupled to the CP and to the multiple integrator cells and configured to adjust a capacitance value of the VCO based on the multiple second tuning signals. The capacitance value and the first tuning signal affect a frequency of the feedback signal. One or more such embodiments may be supplemented using one or more of the following concepts, in any order and in any combination: further comprising a low-pass filter coupled to the CP; wherein the low-pass filter comprises multiple capacitors and a resistor; wherein the low-pass filter comprises multiple capacitors and a switch; further comprising a logic NOR gate to control the switch, the NOR gate configured to receive the feedback signal and the phase-frequency reference signal as inputs; further comprising a comparator configured to receive the first tuning signal and the voltage reference signal as inputs; wherein the comparator produces a comparator output that controls multiple current sources in the multiple integrator cells; wherein alteration of the multiple current sources causes a change in the frequency of the feedback signal; wherein the multiple integrator cells cause the first tuning signal to remain within a predetermined voltage range; wherein each of the multiple integrator cells provides an output signal to control a corresponding transistor switch in the VCO, and wherein each corresponding transistor switch is configured to increase or decrease the capacitance value.

In some embodiments, a phase-locked loop (PLL) system comprises a comparator configured to receive a voltage reference signal and a tuning signal and to produce a comparator output. The system also comprises a chain of integrator cells coupled to a plurality of transistor switches and configured to operate the plurality of transistor switches based on the comparator output. The system further includes a voltage-controlled oscillator (VCO) comprising a plurality of capacitors coupled to the plurality of transistor switches. The VCO is configured to provide an output signal having a frequency based at least in part on at least one of the plurality of capacitors. One or more such embodiments may be supplemented using one or more of the following concepts, in any order and in any combination: wherein the VCO comprises the plurality of transistor switches; further comprising a filter, positioned between the comparator and a charge pump, that is configured to dampen a ripple associated with a PLL update; wherein the tuning signal maintains a voltage within a predetermined range of the voltage reference signal; wherein the voltage reference signal is within 10% of half of a voltage rail supply.

In some embodiments, a method comprises generating a tuning signal in a phase-locked loop (PLL) based on a phase-frequency reference signal and a voltage-controlled oscillator (VCO) feedback signal, providing the tuning signal to the VCO, controlling a capacitance value of the VCO based on a comparison of the tuning signal and a voltage reference signal, and generating the VCO feedback signal based on the tuning signal and the capacitance value. One or more such embodiments may be supplemented using one or more of the following concepts, in any order and in any combination: wherein controlling the capacitance value of the VCO comprises controlling multiple transistor switches coupled to multiple capacitors, the multiple transistors switches and the multiple capacitors located within the VCO; further comprising maintaining the tuning signal within a predetermined voltage range; wherein controlling the capacitance value comprises using a comparator, and further comprising using a resistor to provide the tuning signal to the comparator; wherein controlling the capacitance value comprises using a comparator, and further comprising using a switch to provide the tuning signal to the comparator.

BRIEF DESCRIPTION OF THE DRAWINGS

For a detailed description of various examples, reference will now be made to the accompanying drawings in which.

DETAILED DESCRIPTION

For at least the reasons set forth above, a PLL that provides minimal VCO gain without requiring a large tuning signal swing is desirable. At least some of the embodiments disclosed herein are directed to methods and systems for maintaining a combination of a smaller voltage-controlled oscillator (VCO) gain and a smaller voltage swing in a fine tuning signal provided to a VCO than is possible in other methods and systems. The disclosed embodiments include a comparator that compares the voltage of the fine tuning signal with a voltage reference signal to produce an output, and a chain of integrator cells that uses the comparator output to produce a coarse tuning signal that controls the frequency of the VCO output signal. Specifically, the comparator output controls the currents generated by the integrator cells, and, in turn, these currents open and close transistor switches in the VCO via the coarse tuning signal. Opening and closing the transistor switches in the VCO causes changes in a capacitor network in the VCO, and such changes in the VCO capacitor network result in a change in the overall capacitance value of the VCO. Adjusting the overall capacitance value in the VCO causes the frequency of the output signal to rise or fall. In this way, the coarse tuning signal maintains the frequency of the VCO output signal close to the target frequency of a reference signal provided to the PLL. The proximity between the VCO output signal frequency and the target frequency as a result of the coarse tuning signal means that a smaller swing is required of the fine tuning signal. In particular, the fine tuning signal may have a voltage swing that is maintained within a narrow range centering on the voltage reference signal provided to the comparator. By maintaining a small swing in the fine tuning signal and a low VCO gain, phase noise is mitigated without the charge pump and varactor linearity problems traditionally associated with reducing VCO gain.

Figure 1:
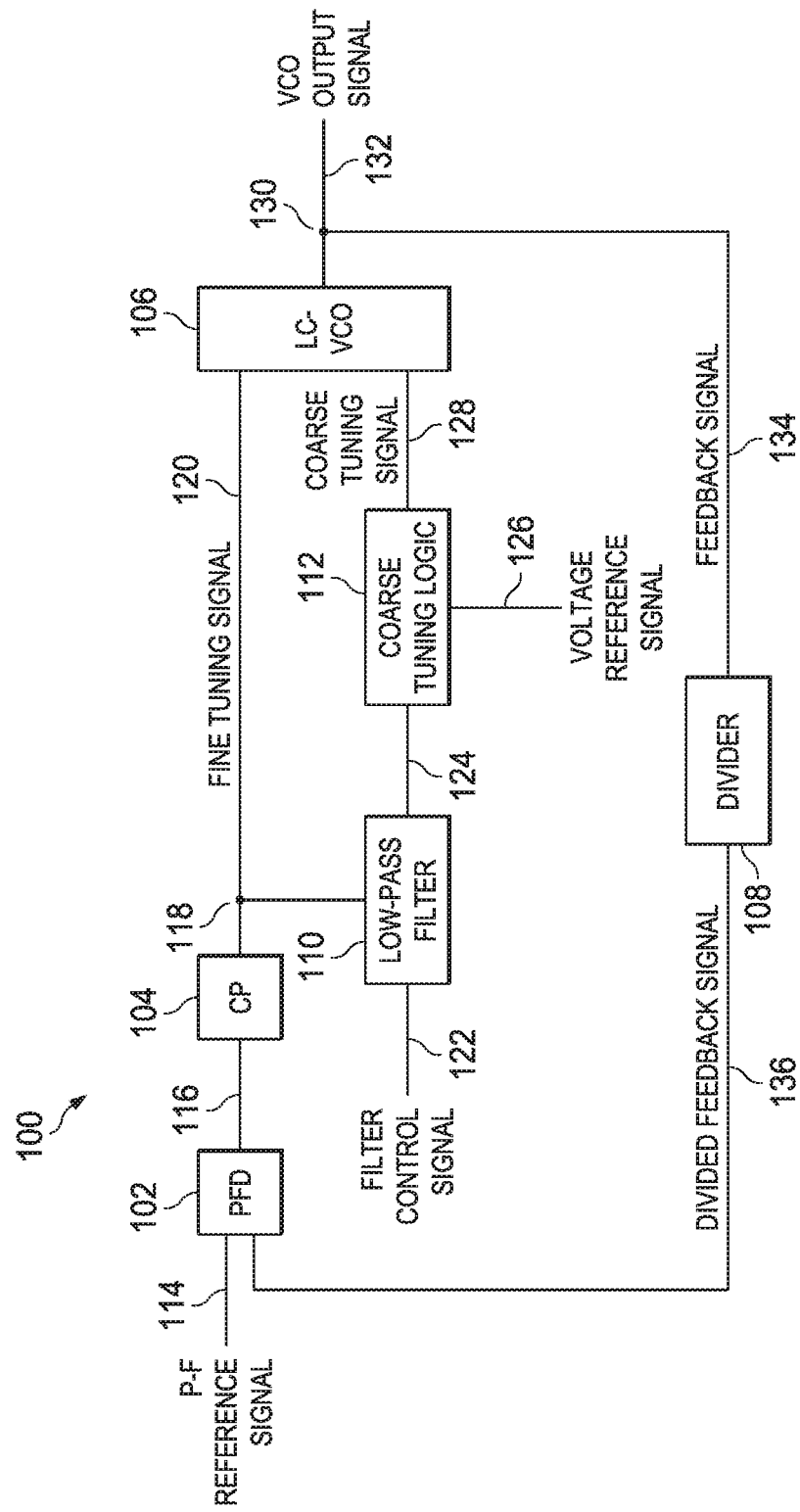
FIG. 1 is a block diagram of a PLL system implementing the techniques described herein.

FIG. 1 is a block diagram of an illustrative PLL system 100 implementing techniques described herein. The system 100 comprises a phase-frequency detector (PFD) 102; a charge pump (CP) 104; an inductor/capacitor voltage-controlled oscillator (LC-VCO) 106; a frequency divider 108; a low-pass filter (LPF) 110; a coarse tuning logic 112; a phase-frequency (P-F) reference signal 114; a PFD output signal 116; a CP output node 118; a fine tuning signal 120; a filter control signal 122; a LPF output signal 124; a voltage reference signal 126; a coarse tuning signal 128; a LC-VCO output node 130; a VCO output signal 132; a feedback signal 134; and a divided feedback signal 136. The feedback signal 134 and the divided feedback signal 136 may be synonymously referred to herein because the divided feedback signal 136 is derived from, and is simply a divided version of, the feedback signal 134.

The P-F reference signal 114 may be a reference signal that has a target frequency and phase that the VCO output signal 132 is to match. In some examples, there may be a phase difference between the VCO output signal 132 and the P-F reference signal 114, but the PLL system 100 may cause such phase difference to remain substantially constant. The P-F reference signal 114 may be generated by any suitable circuit, either internal or external to the PLL system 100. The PFD 102 receives the P-F reference signal 114 and a divided feedback signal 136, the latter being derived from the output of the LC-VCO 106. The PFD 102 determines the difference between the P-F reference signal 114 and the divided feedback signal 136 to produce a PFD output signal 116. The PFD output signal 116 is provided to the CP 104. The CP 104, in some embodiments, comprises a bipolar switched current source that uses the PFD output signal 116 to produce the fine tuning signal 120 at node 118. The fine tuning signal 120 may be provided to the LC-VCO 106, and the LC-VCO 106 may use the fine tuning signal 120 to adjust the frequency of the VCO output signal 132 upward or downward toward the P-F reference signal 114. The LC-VCO 106 adjusts the frequency of the VCO output signal 132 by adjusting a varactor diode within the LC-VCO 106 (e.g., element 610 in FIG. 6, described below).

In some embodiments, the voltage swing of the fine tuning signal 120 may be kept small compared to the swing that would otherwise be present by using the fine tuning signal 120 to generate a coarse tuning signal 128. The coarse tuning signal 128 brings the P-F reference signal 114 close to the P-F reference signal 114 so that the fine tuning signal 120 need only cause minor shifts in the VCO output signal 132 frequency to obtain a lock between the VCO output signal 132 and the P-F reference signal 114.

The coarse tuning signal 128 is generated using the LPF 110 and the coarse tuning logic 112. Specifically, the LPF 110 receives the fine tuning signal, filters the signal, and produces a filtered signal 124. The LPF 110 may allow signals of any suitable frequency band to pass through (e.g., 100 kHz-10 MHz). The coarse tuning logic 112 receives the filtered signal and compares it to a voltage reference signal 126. The coarse tuning logic 112 uses the result of the comparison to adjust the overall capacitance of the LC-VCO 106, which, in turn, causes the frequency of the VCO output signal 132 (and the equivalent feedback signal 134) to move toward the P-F reference signal 114. The voltage reference signal 126 may be any suitable voltage, but, in at least some embodiments, it is half of the rail voltage supply ($V_{DD}$) provided to the PLL system 100 or it is within 10% of half of the rail voltage supply.

The filter control signal 122 may be used to control components, e.g., switches within the LPF 110 as described below. The divider 108 is a frequency divider that divides the frequency of the feedback signal 134 down by a predetermined factor (e.g., one-quarter, one-half) to produce the divided feedback signal 136. The divided feedback signal 136, in turn, is provided as an input into the PFD 102.

Figure 2:
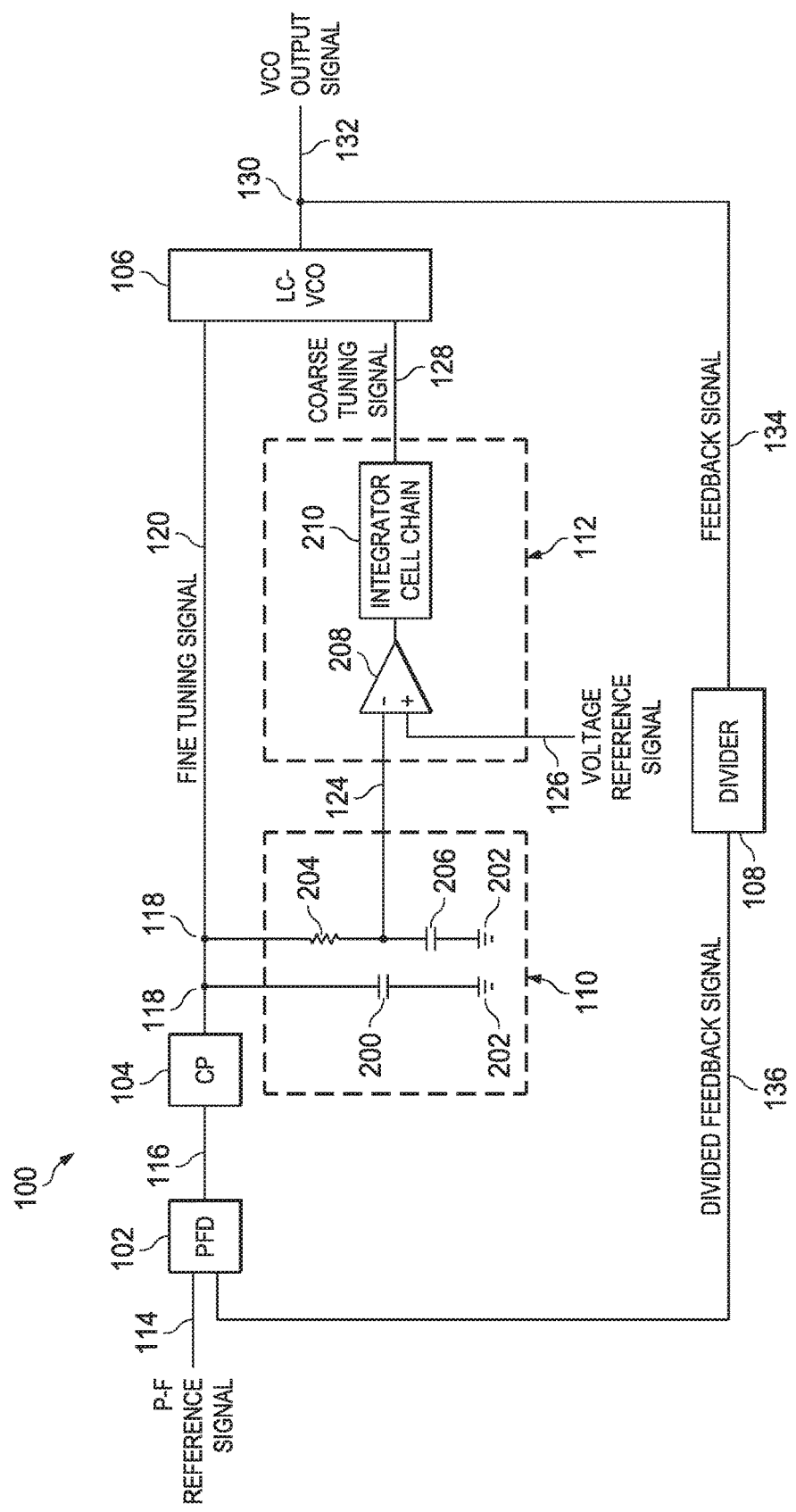
FIG. 2 is a circuit schematic diagram of a PLL system implementing the techniques described herein.

FIG. 2 is a circuit schematic diagram of the PLL system 100. Specifically, FIG. 2 depicts the contents of the LPF 110 and the coarse tuning logic 112. The LPF 110 includes a capacitor 200 (e.g., 50 pF) coupled to node 118 and to ground 202. The LPF 110 further comprises a resistor 204 (e.g., 2 kOhms) coupled to node 118 and to a capacitor 206 (e.g., 500 pF). The capacitor 206 couples to ground 202. The LPF 110 averages the proportional charge pump current over the entire update period (i.e., the time period required to update the capacitor 206 with the value present at the capacitor 200) to minimize voltage ripple. The result is a reduction in phase noise.

In the example of FIG. 2, the coarse tuning logic 112 includes a comparator 208 that receives two inputs: the voltage reference signal 126, and the signal present at the node between the resistor 204 and the capacitor 206. The comparator 208 provides a comparator output signal to an integrator cell chain 210. The integrator cell chain 210 contains multiple integrator cells, described below, each of which couples to a different capacitor in the LC-VCO 106. The integrator cell chain 210 provides the coarse tuning signal 128 (which, in some embodiments, actually comprises multiple tuning signals, each of which is provided by a separate integrator cell in the integrator cell chain 210) to the LC-VCO 106. The coarse tuning signal 128 causes capacitors in the LC-VCO 106 to be added to or removed from the overall capacitance of the LC-VCO 106. Changes in the overall capacitance value of the LC-VCO 106 cause the frequency of the VCO output signal 132 to change and approach the voltage reference signal 126. The integrating nature of the integrator cells causes a smooth frequency response in the VCO output signal 132.

Figure 3:
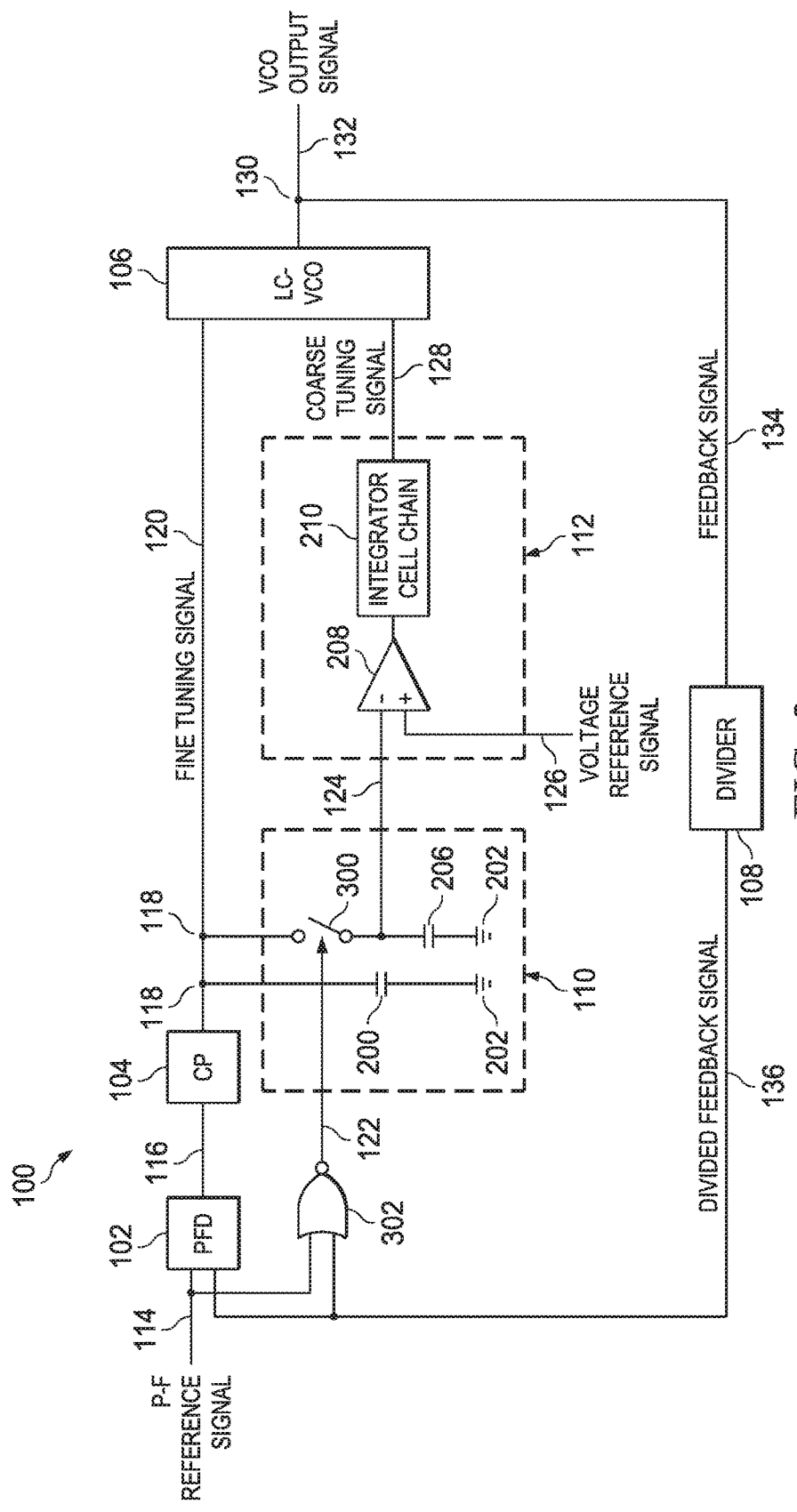
FIG. 3 is another circuit schematic diagram of a PLL system implementing the techniques described herein.

FIG. 3 is a circuit schematic diagram of the PLL system 100. The embodiment depicted in FIG. 3 differs from that depicted in FIG. 2 only in the design of the LPF 110. Specifically, the LPF 110 in FIG. 3 includes a switch 300 (e.g., a transistor) positioned between the node 118 and the inverting input to the comparator 208. The switch 300 is controlled by the filter control signal 122. In some embodiments, the filter control signal 122 is generated by a logic NOR gate 302, which receives the P-F reference signal 114 and the divided feedback signal 136 as inputs. When both of these inputs are LOW, the filter control signal 122 is HIGH, and the switch 300 is closed. If either of the inputs to the NOR gate 302 is HIGH, the filter control signal 122 is LOW, and the switch 300 is open. When the switch 300 is closed, the charge present at the capacitor 200 is applied to the capacitor 206. In this way, signal updates are provided to the capacitor 206 when the clock signals input into the PFD 102 are both low—that is, when no new pulses are incoming. This time period during which the pulses are simultaneously low may be termed a "PLL update period."

Figure 4:
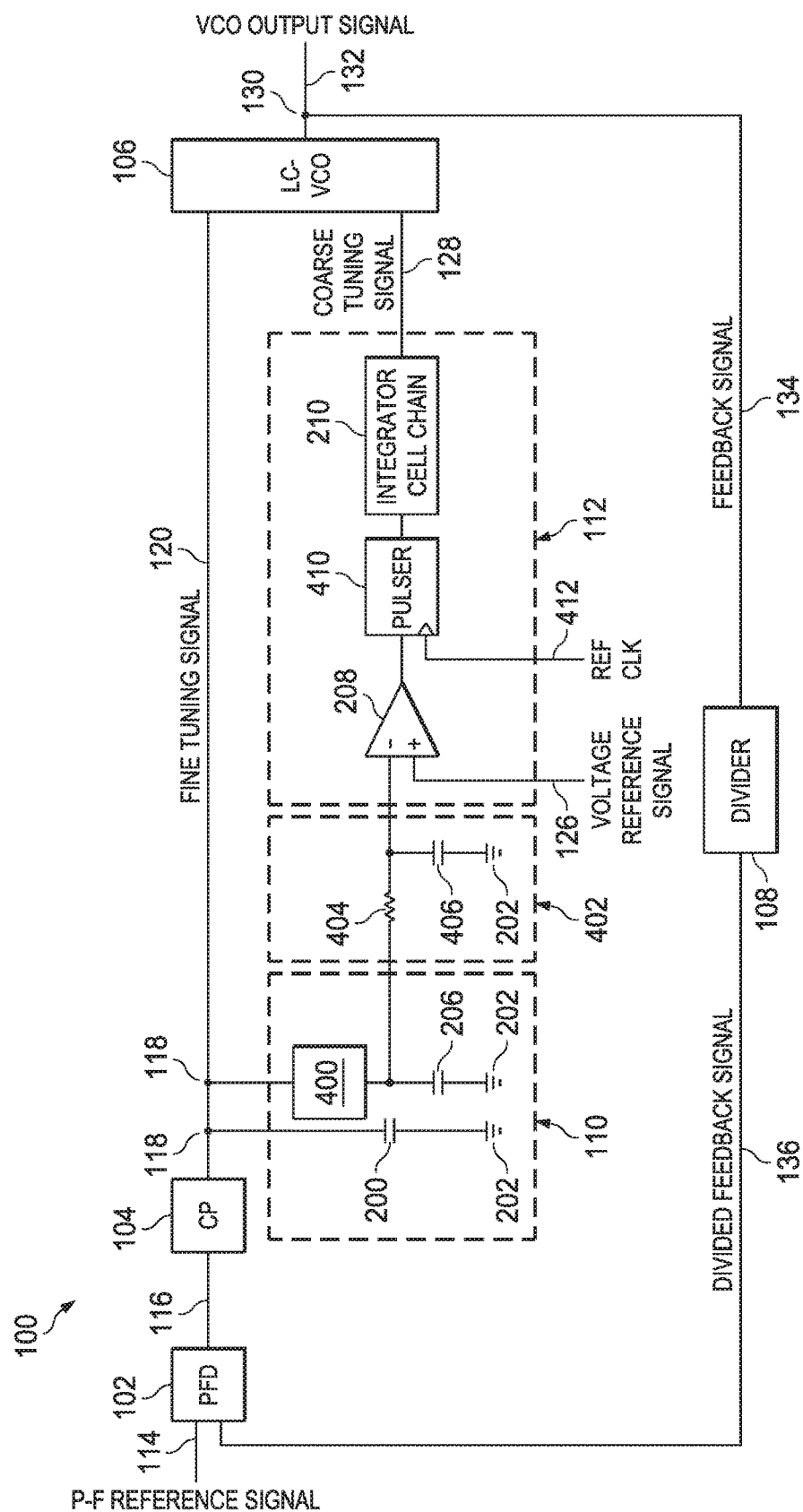
FIG. 4 is another circuit schematic diagram of a PLL system implementing the techniques described herein.

FIG. 4 is another circuit schematic diagram of a PLL system 100 implementing the techniques described herein. The embodiment depicted in FIG. 4 is identical or nearly identical to those depicted in FIGS. 2 and 3, with some exceptions. For instance, the LPF 110 includes a component 400, which may include a resistor (as depicted in FIG. 2) or a switch (as depicted in FIG. 3). In addition, the PLL system 100 of FIG. 4 includes a filter 402 to reduce the PLL update ripple (i.e., noise introduced when the capacitor 206 is updated using the capacitor 200 as a result of the filter control signal 122 changing states) before the signal is provided to the comparator 208. In some embodiments, the filter 402 includes a resistor 404 (e.g., 10 kilo-Ohms), a capacitor 406 (e.g., 500 pF), and a ground connection 202. Further, the PLL system 100 of FIG. 4 comprises a pulser 410 positioned between the comparator 208 and the integrator cell chain 210. The pulser 410 receives the output of the comparator 208 as an input, receives a suitable clock signal 412 (e.g., having a frequency of the P-F reference signal 114) as another input, and provides its output to the integrator cell chain 210. The pulser 410 divides the direct current into current pulses, which mitigates phase noise introduced by the integrator cells in the integrator cell chain 210 and provides a lower bandwidth of the integrator path.

Figure 5:
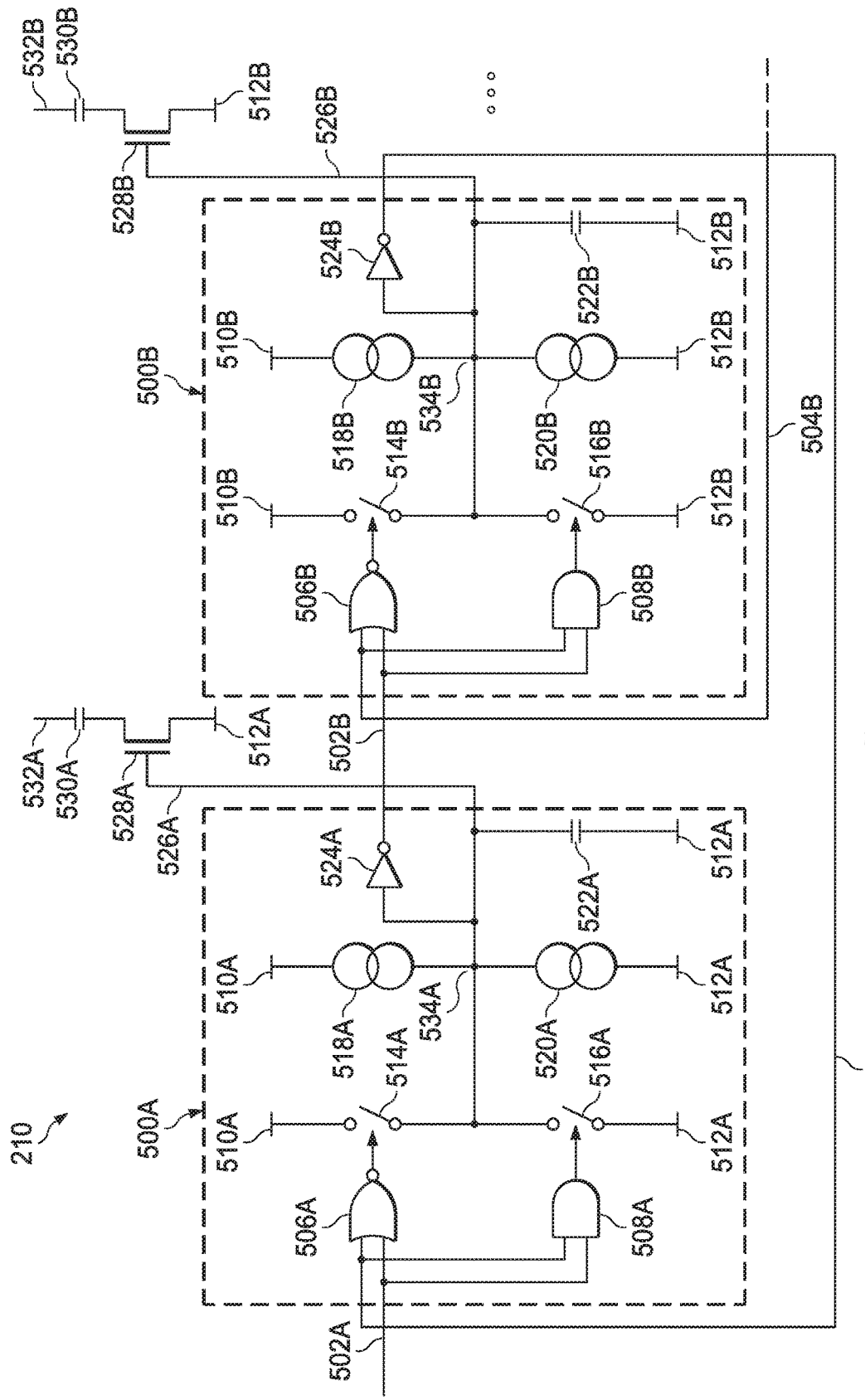
FIG. 5 is a circuit schematic diagram of an integrator cell chain for use in a PLL system.

FIG. 5 is a circuit schematic diagram of an illustrative portion of an integrator cell chain 210 for use in a PLL system 100. FIG. 5 depicts only two integrator cells 500A and 500B, although the integrator cell chain 210 may have any suitable number of integrator cells. Cells 500A and 500B are virtually identical except for the external electrical connections between the cells and other circuitry, as will be explained. Cell 500A comprises input connections 502A (e.g., coupling to a voltage supply rail $V_{DD}$, such as voltage supply rail 510A) and 504A (e.g., coupling to a feedback loop from an output of the integrator cell 500B), both of which are provided to a logic NOR gate 506A and a logic AND gate 508A. The output of the NOR gate 506A controls a switch (e.g., transistor) 514A, and the output of the AND gate 508A controls a switch (e.g., transistor) 516A. The switch 514A connects the voltage supply rail 510A and a node 534A. The switch 516A connects ground 512A and the node 534A. Cell 500A further includes a current source 518A coupled between power supply 510A and the node 534A, and a current source 520A coupled between ground 512A and the node 534A. The current sources 518A and 520A are controlled by the output of the comparator 208. For example, each of current sources 518A and 518B may have a current control input that is coupled to the output of the comparator 208. The current sources 518A and 520A couple at node 534A. The node 534A provides an input to an inverter 524A, the output of which is provided to the input 502B of cell 500B. A capacitor 522A couples the node 534A to ground 512A. The node 534A couples to the gate of transistor (e.g., NMOS) 528A and thus controls the flow of current through the transistor 528A. In some embodiments, the source of the transistor 528A couples to ground 512A and the drain of the transistor 528A couples to a capacitor 530A. In some embodiments, the transistor 528A and the capacitor 530A are located within the LC-VCO 106. In some embodiments, either the transistor 528A or the capacitor 530A is located within the LC-VCO 106. In some embodiments, neither the transistor 528A nor the capacitor 530A is located within the LC-VCO 106. The precise manner in which the transistor 528A and capacitor 530A may couple within the LC-VCO 106 is described below with respect to FIG. 6.

In operation, the output of the comparator 208 causes the current sources 518A and 520A to provide for increased or decreased current at the node 534A. (Although a single output from the comparator 208 is shown in the figures for clarity, the comparator 208 in at least some embodiments has multiple mirrored outputs, each one controlling a different current source in the integrator cell chain 210. This may be accomplished using, for instance and without limitation, a transconductance amplifier.) If the current produced by current source 518A is increased above that provided by the current source 520A, the node 534A is HIGH, the NMOS transistor 528A is ON, and the frequency of the VCO output signal 132 drops because—as described below—the overall capacitance of the LC-VCO 106 rises. If the current produced by current source 520A is increased above that provided by the current source 518A, the node 534A is LOW, the NMOS transistor 528A is OFF, and the frequency of the VCO output signal 132 increases because—as described below—the overall capacitance of the LC-VCO 106 drops. One purpose of the capacitor 522A is to define the pole of the integrator chain and, thus, the speed of the frequency control. The speed of the frequency control should be relatively slow in comparison to the PLL bandwidths. The frequency control (integrator chain) should not influence the PLL behavior. The switches 514A and 516A short the current sources 518A and 520A, respectively, depending on the outputs of the NOR gate 506A and AND gate 508A, respectively. The capacitor 530A couples to the remainder of the LC-VCO 106 via node 532A.

The contents and operation of the integrator cell 500B is virtually identical to that of integrator cell 500A. The inputs and outputs of the two integrator cells, however, differ. The inputs to the gates 506A and 508A include the voltage supply rail at input 502A and the feedback loop from an output of the integrator cell 500B at input 504A. The inputs to the corresponding gates 506B and 508B include the output of the inverter 524A in the integrator cell 500A and the feedback loop from an output of the next integrator cell placed consecutively after the integrator cell 500B. (The inputs to the logic gates of the final integrator cell in the integrator cell chain 210 may include an output of the preceding integrator cell and a feedback line from the succeeding integrator cell, which, in the case of the final integrator cell, couples to ground.) The integrator cell 500B operates to control the capacitance of the capacitor 530B by controlling the gate of the transistor (e.g., NMOS) 528B. The capacitor 530B couples to the remainder of the LC-VCO 106 via node 532B.

Figure 6:
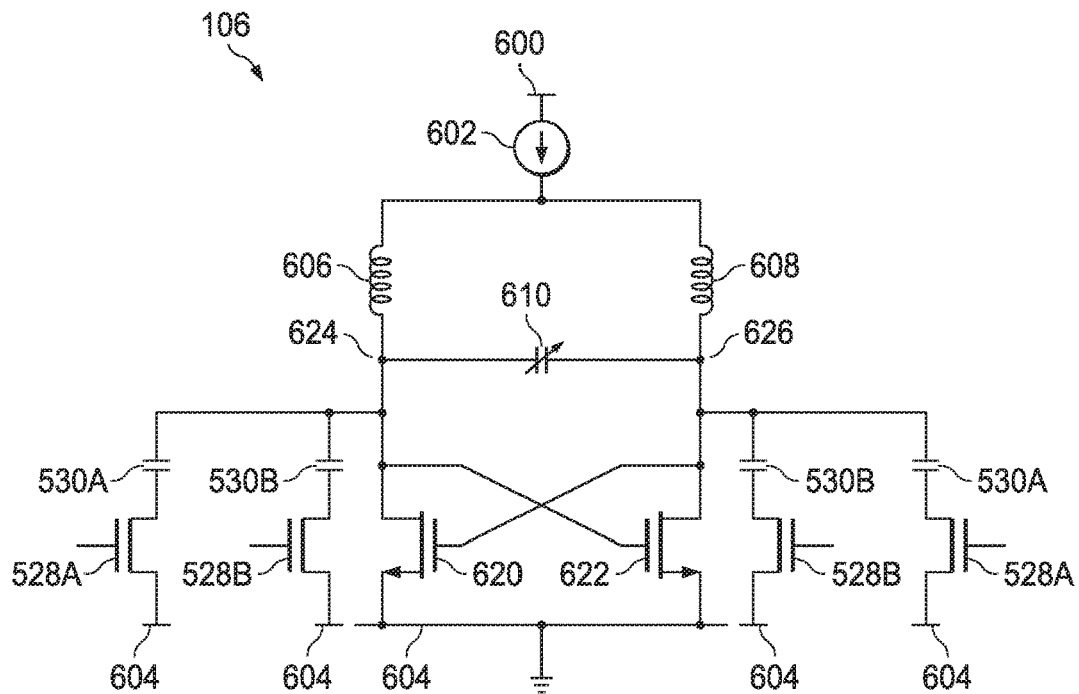
FIG. 6 is a circuit schematic diagram of an inductor/capacitor voltage-controlled oscillator (LC-VCO) for use in a PLL system.

FIG. 6 is a circuit schematic diagram of at least a portion of an illustrative LC-VCO 106. The LC-VCO 106 comprises a voltage supply rail connection 600; a current source 602 (e.g., 12 mA); a pair of inductors 606, 608 (e.g., 120 pH); nodes 624 and 626 between which a variable capacitor 610 is positioned; transistors (e.g., NMOS) 620, 622 whose gates couple to nodes 626 and 624, respectively; and a ground connection 604 that couples to the sources of the transistors 620, 622. The LC-VCO 106 further includes the transistors 528A, 528B and capacitors 530A, 530B described above with respect to FIG. 5. The set of transistors and capacitors that couples to the node 624 is replicated to couple to the node 626, as shown. The variable capacitor 610 may include a capacitance control input that is coupled to the fine tuning signal 120 via a fine tuning signal input of the LC-VCO 106. Each of transistors 528A, 528B may have a control input that is coupled to an output of a respective integrator cell. For example, the gates of transistors 528A (left-hand and right-hand sides) may be coupled to the output of a first integrator cell, and the gates of transistors 528B (left-hand and right-hand side) may be coupled to the output of a second integrator cell. Activating one or more transistors (e.g., transistors 528A, 528B) effectively causes the corresponding capacitors (e.g., capacitors 530A, 530B) to be coupled in parallel. In turn, this effectively increases the overall capacitance of the LC-VCO 106. Conversely, deactivating transistors decreases the overall capacitance of the LC-VCO 106. Activating or deactivating even a single transistor, in some embodiments, may affect the overall capacitance of the LC-VCO 106. The output of the LC-VCO 106 is across terminals nodes 624 and 626. By increasing and decreasing capacitance of the LC-VCO 106 in this manner, the frequency of the VCO output signal 132 can be decreased or increased to more closely match the frequency of the P-F reference signal 114. This, in turn, causes the fine tuning signal 120 to have a smaller voltage swing than would otherwise be the case. When the fine tuning signal 120 has a smaller voltage swing and the gain of the LC-VCO 106 is kept low (e.g., gain factor of 10 MHz/V), phase noise is mitigated without the charge pump and varactor linearity problems traditionally associated with reducing VCO gain.

Figure 7:
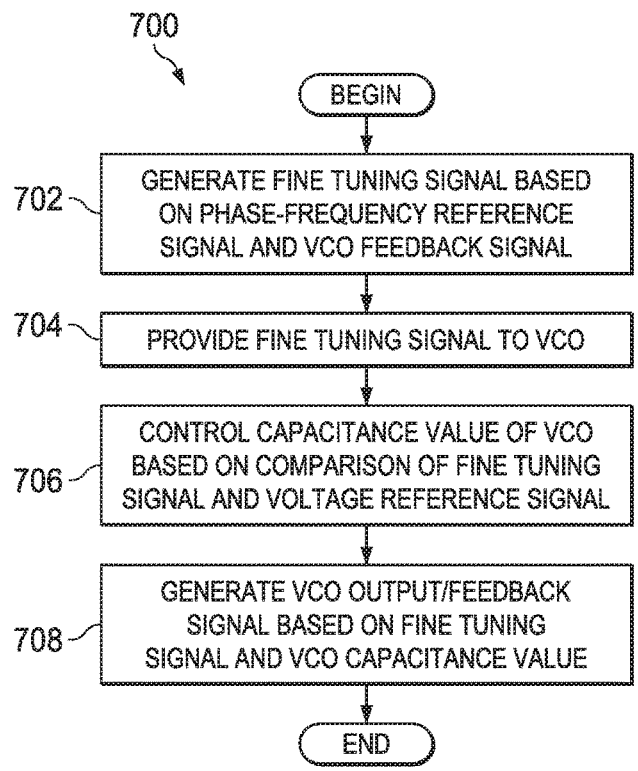
FIG. 7 is a flow diagram of a method for operating a PLL system according to various embodiments.

FIG. 7 is a flow diagram of a method 700 for operating a PLL system according to various embodiments. The method 700 begins by generating a fine tuning signal based on a phase-frequency reference signal and a VCO feedback signal (step 702). The method 700 next comprises providing the fine tuning signal to the VCO (step 704). For the reasons provided above, the fine tuning signal will have a smaller voltage swing than would be the case if the techniques disclosed herein were not implemented—e.g., a narrow range above and below half of the voltage supply rail. The method 700 next includes controlling the overall capacitance value of the LC-VCO based on a comparison of the fine tuning signal and a voltage reference signal (step 706). In some examples, the comparison may be a comparison between a low-pass filtered version of the fine tuning signal and the voltage reference signal. As explained in detail above, the result of the comparison of the fine tuning signal and the voltage reference signal manipulates the output of current sources in the integrator cell chain. This, in turn, opens and closes transistors, which increases of decreases the overall capacitance of the LC-VCO by manipulating a network of capacitors coupled to the transistors. The method 700 finally comprises generating a VCO output/feedback signal based on the fine tuning signal and the VCO capacitance value (e.g., by using the fine tuning signal to adjust a varactor value in the LC-VCO) (step 708). The method 700 may be modified as desired, including by adding, deleting, modifying or rearranging one or more steps.

The above discussion is meant to be illustrative of various embodiments. Numerous variations and modifications will become apparent to those skilled in the art once the above disclosure is fully appreciated. It is intended that the following claims be interpreted to embrace all such variations and modifications.

What is claimed is:

1. A phase-locked loop (PLL) system, comprising:
a phase-frequency detector (PFD) configured to compare a phase-frequency reference signal and a feedback signal;
a charge pump (CP) electrically coupled to the PFD and configured to produce a first tuning signal based on an output of the PFD;
multiple integrator cells electrically coupled to the CP and configured to output multiple second tuning signals based on a voltage of the first tuning signal relative to a voltage reference signal; and
a voltage-controlled oscillator (VCO) electrically coupled to the CP and to the multiple integrator cells and configured to adjust a capacitance value of the VCO based on the multiple second tuning signals, the capacitance value and the first tuning signal affecting a frequency of the feedback signal;
wherein a frequency of an output signal of the VCO is adjusted by a varactor diode within the VCO.

2. The system of claim 1, further comprising a low-pass filter coupled to the CP.

3. The system of claim 2, wherein the low-pass filter comprises multiple capacitors and a resistor.

4. The system of claim 2, wherein the low-pass filter comprises multiple capacitors and a switch.

5. The system of claim 4, further comprising a logic NOR gate to control the switch, the NOR gate configured to receive the feedback signal and the phase-frequency reference signal as inputs.

6. The system of claim 1, further comprising a comparator configured to receive the first tuning signal and the voltage reference signal as inputs.

7. The system of claim 6, wherein the comparator produces a comparator output that controls multiple current sources in the multiple integrator cells.

8. The system of claim 7, wherein alteration of the multiple current sources causes a change in the frequency of the feedback signal.

9. The system of claim 1, wherein the multiple integrator cells cause the first tuning signal to remain within a predetermined voltage range.

10. The system of claim 1, wherein each of the multiple integrator cells provides an output signal to control a corresponding transistor switch in the VCO, and wherein each corresponding transistor switch is configured to increase or decrease the capacitance value.

11. A phase-locked loop (PLL) system, comprising:
- a comparator configured to receive a voltage reference signal and a tuning signal and to produce a comparator output;
- a chain of integrator cells coupled to a plurality of transistor switches and configured to operate the plurality of transistor switches based on the comparator output; and
- a voltage-controlled oscillator (VCO) comprising a varactor diode;
- wherein a frequency of an output signal of the VCO is adjusted by the varactor diode.

12. The system of claim 11, further comprising a filter, positioned between the comparator and a charge pump, that is configured to dampen a ripple associated with a PLL update.

13. The system of claim 11, wherein the tuning signal maintains a voltage within a predetermined range of the voltage reference signal.

14. The system of claim 13, wherein the voltage reference signal is within 10% of half of a voltage rail supply.

* * * * *